(12) United States Patent
Reetz et al.

(10) Patent No.: US 6,309,798 B1
(45) Date of Patent: Oct. 30, 2001

(54) LITHOGRAPHICAL PROCESS FOR PRODUCTION OF NANOSTRUCTURES ON SURFACES

(75) Inventors: Manfred T. Reetz; Martin Winter, both of Mülheim an der Ruhr; Günter Dumpich; Jens Lohau, both of Duisburg, all of (DE)

(73) Assignee: Studiengesellschaft Kohle mbH, Mulheim an der Ruhr (DE)

( * ) Notice: Subject to any disclaimer, the term of this patent is extended or adjusted under 35 U.S.C. 154(b) by 0 days.

(21) Appl. No.: 09/180,324

(22) PCT Filed: May 3, 1997

(86) PCT No.: PCT/EP97/02264

§ 371 Date: Nov. 5, 1998

§ 102(e) Date: Nov. 5, 1998

(87) PCT Pub. No.: WO97/42548

PCT Pub. Date: Nov. 13, 1997

(30) Foreign Application Priority Data

May 8, 1996 (DE) .............................................. 196 18 447

(51) Int. Cl.$^7$ ....................................................... G03F 7/00
(52) U.S. Cl. ........................................... 430/296; 430/311
(58) Field of Search .................................... 430/296, 311, 430/322; 427/96

(56) References Cited

FOREIGN PATENT DOCUMENTS 2337892    8/1977  (FR) .
94 11787   5/1994  (WO) .

OTHER PUBLICATIONS

Gross et al., "Ion–beam direct–write mechanisms in palladium acetate films", Journal of Applied Physics, pp. 1403–1410, Aug. 1989.*

IBM TDB, vol. 31, No. 8, 1989, pp. 347–348, XP002038177.

* cited by examiner

*Primary Examiner*—Kathleen Duda
(74) *Attorney, Agent, or Firm*—Norris McLaughlin & Marcus

(57) ABSTRACT

A lithographic method for the generation of nanostructures on surfaces, characterized in that either stabilized nanometer-sized transition metal clusters or colloids of metals of groups 4, 5, 6, 7, 8, 9, 10, 11 or 12 of the Periodic Table, their stabilized metal oxide or metal sulfide analogues, polynuclear metal carbonyl clusters having stoichiometrically defined compositions, or polynuclear metal clusters having stoichiometrically defined compositions or having bridges consisting of main group elements, respectively in the form of a solution, are coated on a surface as a film which is imagewise exposed with an electron beam, wherein defined structures in the nanometer range are generated on the surface after washing off the unexposed portions of the film, optionally followed by annealing.

11 Claims, 17 Drawing Sheets

(2 of 17 Drawing Sheet(s) Filed in Color)

Typical lithographic process

Scanning electron micrograph of the
conductor tracks with contacts

Scanning electron micrograph
of two conductor tracks

Scanning electron micrograph of the
conductivity sample (Figure 3) with large
contacts for conductivity measurement Atomic force micrograph of the
conductor tracks with contacts Scanning electron micrograph of the
conductor tracks with contacts Scanning electron micrograph
of the five conductor tracks Scanning electron micrograph
of one conductor tracks Scanning electron micrograph of the
conductor tracks with contacts Scanning electron micrograph
of three conductor tracks Scanning electron micrograph
of one conductor track Scanning electron micrograph of the
conductor tracks with contacts Scanning electron micrograph of the
conductivity sample with large contacts Scanning electron micrograph
of two conductor tracks Scanning electron micrograph
of one conductor track Atomic force micrograph of the
conductor tracks with contacts

LITHOGRAPHICAL PROCESS FOR PRODUCTION OF NANOSTRUCTURES ON SURFACES

This application is a 371 of PCT/EP97/02264, which was filed on May 3, 1997.

The present invention relates to a novel lithographic method by which arbitrary nanometer-sized structures can be generated on surfaces with particular ease. In particular, it relates to the writing of patterns, i.e., of nanometer-sized lines or dots consisting of metals or metal alloys.

BRIEF DESCRIPTION OF THE DRAWINGS

The file of this patent contains at least one drawing executed in color. Copies of this patent with color drawing (s) will be provided by the Patent and Trademark Office upon request and payment of the necessary.

The invention will now be described in further detail with reference to the drawings wherein.

Figure 1:
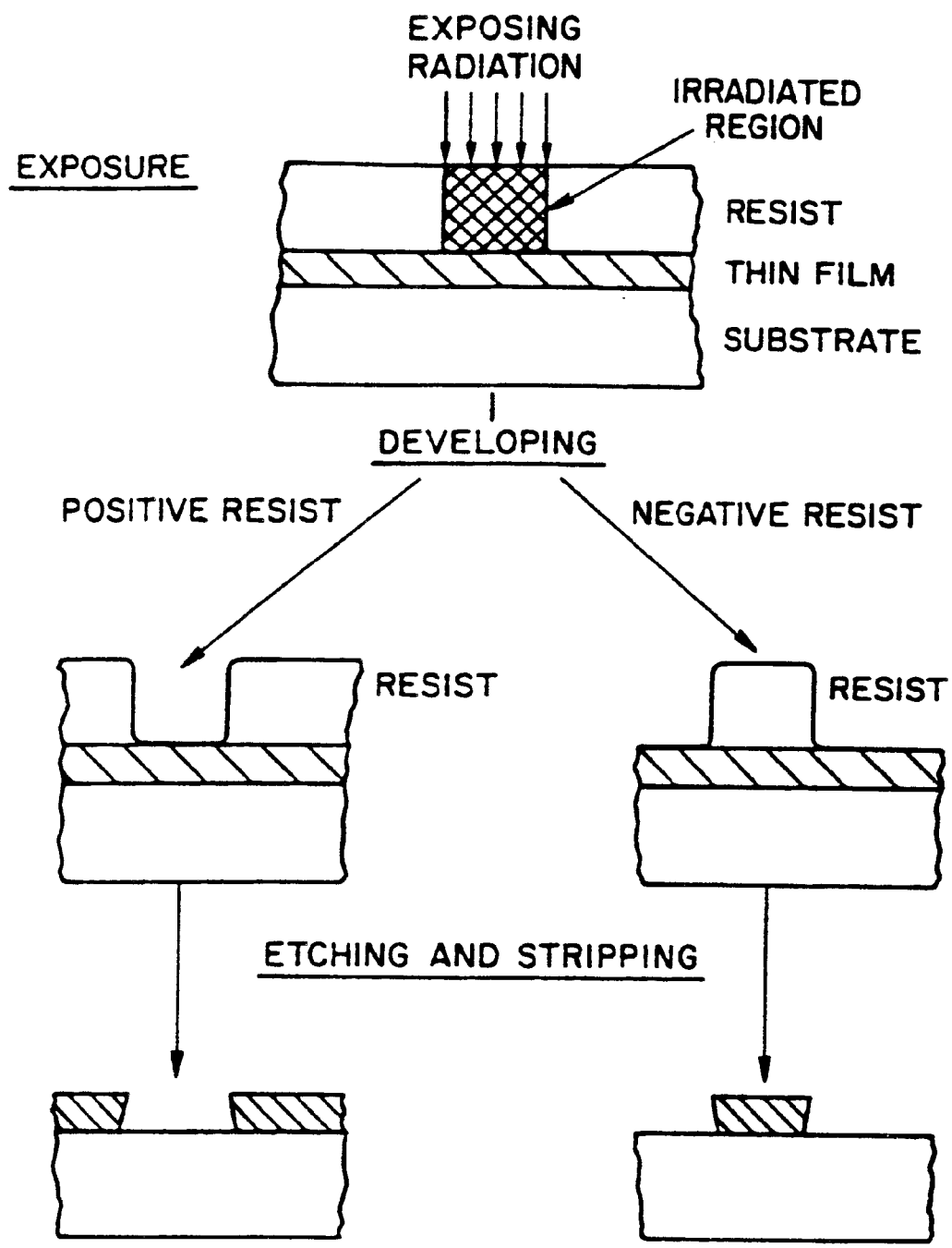
FIG. 1 is a drawing depicting a typical lithographic process scheme.

The industrial microelectronics usually employs photolithography for the generation of micrometer-sized patterns, especially conductor tracks (R. Enderlein, Mikroelektronik, Spektrum Akademischer Verlag, Heidelberg, 1993) In this field and in other technical applications, a further miniaturization of the patterns is sought. Thus, for example, the scale of integration of silicon circuits can be increased by reducing the dimensions of functional elements. In the field of submicron technology, the electron beam lithography appears to be very promising currently, but X-ray lithography and ion beam lithography are also employed in research work. A wide variety of applications of the thus generated surface structures are potentially possible, e.g., integrated circuits, magnetic storage media, sensors, etc. [E. Reichmanis, L. F. Thompson, Chem. Rev. 89 (1989) 1273]. Independent of the energy source, a lithographic process consists of several steps, as shown in the scheme (FIG. 1) taken from the reference Chem. Rev. 89 (1989) 1273.

Prior to the actual lithographic process, the precursor materials must first be prepared. This involves the coating of a thin film (e.g., semiconductor, metal, etc.) on a substrate. Then, a radiation-sensitive resist (polymer) is applied on top thereof.

Electron beam lithography is also used to prepare nanostructured magnetic materials for magnetic storage media. Thus, for example, magnetic lines and columns made of nickel were prepared in sizes of 15 to 200 nm [P. R. Krauss, P. B. Fischer, S. Y. Chou, J. Vac. Sci. Technol. B12 (1994) 3639; S. Y. Chou, P. R. Krauss, M. S. Wei, P. B. Fischer, Scripta Metallurgica Materiala 33 (1995) 1537]. This also involves a multi-step process in which one step includes an expensive and complicated metal vaporization.

Another method for generating lines of metals on surfaces makes use of ion beam lithography [M. E. Gross, W. L. Brown, L. R. Harriott, K. D. Cummings, J. Linnros, H. Funsten, J. Appl. Phys. 66 (1989) 1403]. Thus, a film of palladium acetate [$Pd(OAc)_2$] is coated on a surface and then exposed to an ion beam. After washing off the excess $Pd(OAc)_2$, Pd lines remain. However, they are relatively thick (0.5 $\mu$m) and do not have a high conductivity. A related process using a copper salt, ($Cu_2(OH_2)_2[O_2C(CH_2)_4CH_3]_4$), and photolysis as the energy source yields copper lines, but the smallest line width is 1 $\mu$m (1000 nm) [A. A. Avey, R. H. Hill, J. Am. Chem. Soc. 118 (1996) 237]. A nanopatterning could not be achieved.

The current research in the field of the nanopatterning of surfaces also includes novel technologies, such as scanning tunnel microscopy (STM) and atomic force microscopy (AFM) [P. Avouris, Atomic and Nanometer Scale Modification of Materials: Fundamentals and Applications, Kluwer Academic Publishers, Dordrecht, 1993; P. Avouris, Acc. Chem. Res. 28 (1995) 95; C. M. Lieber, J. Liu, P. E. Sheehan, Angew. Chem. 108 (1996) 748; Angew. Chem. Int. Ed. Engl. 35 (1996) 686; L. A. Nagahara, H. Ohno, H. Tokumoto, J. Photopolym. Sci. Techn. 8 (1995) 669; R. Yang, D. F. Evans, W. A. Hendrickson, Langmuir 11 (1995) 211]. However, these are expensive and complicated methods.

The present invention relates to a simple lithographic method for the generation of nanostructures on surfaces, characterized in that either stabilized nanometer-sized transition metal clusters or colloids of metals of groups 4, 5, 6, 7, 8, 9, 10, 11 or 12 of the Periodic Table, their stabilized metal oxide or metal sulfide analogues, polynuclear metal carbonyl clusters having stoichiometrically defined compositions, or polynuclear metal clusters having stoichiometrically defined compositions or having bridges consisting of main group elements, respectively in the form of a solution, are coated on a surface as a film which is imagewise exposed with an electron beam, wherein defined structures in the nanometer range are generated on the surface after washing off the unexposed portions of the film, optionally followed by annealing.

Whereas metal powders or wires are insoluble in common solvents, it is known that the same metals can be easily solubilized in the form of stabilized metal clusters or metal colloids (G. Schmid, Clusters and Colloids, VCH, Weinheim, 1994). Metal clusters, often also designated as metal colloids, are stabilized by a wide variety of materials which thus prevent the undesired agglomeration of the metal particles. In the literature, a number of methods are found which allow to prepare stabilized metal and bimetallic clusters having a relatively narrow size distribution in the nanometer range.

The materials which stabilize metal clusters and bimetallic clusters include tetraalkylammonium and -phosphonium salts [M. T. Reetz, W. Helbig, J. Am. Chem. Soc. 116 (1994) 7401; M. T. Reetz, W. Helbig, S. A. Quaiser, Chem. Mater. 7 (1995) 2227; M. T. Reetz, S. A. Quaiser, Angew. Chem. 107 (1995) 2461; Angew. Chem. Int. Ed. Engl. 34 (1995) 2240; Studiengesellschaft Kohle mbH, EP-A-0 672 765 (Inventors: M. T. Reetz, W. Helbig, S. A. Quaiser, priority of March 14 and Dec. 6, 1994); H. Bönnemann, in Active Metals: Preparation, Characterization, Applications (A. Fürstner, ed.), VCH, Weinheim, 1996; Studiengesellschaft Kohle mbH, PCT WO 92/18246 (Inventors: H. Bönnemann, W. Brijoux, R. Brinkmann, E. Dinjus, R. Fretzen, B. Korall, priority of Apr. 10, 1991)]. The stabilizing surfactants form a protective shell around the spherical metal particle (M. T. Reetz et al., Science 267, 367–369 (1995)).

Polymers such as polyvinylpyrrolidone [J. S. Bradley, in Clusters and Colloids (G. Schmid, ed.), VCH, Weinheim, 1994] or special ligands such as phosphanes or phenanthroline derivatives (G. Schmid, Clusters and Colloids, VCH, Weinheim, 1994) also stabilize metal clusters.

A totally different class of metal clusters includes ligand-bridged or ligand-complexed molecules having clearly defined stoichiometric compositions (so-called cluster complexes), such as metal carbonyl clusters or metal clusters with bridging main group elements (G. Schmid, Clusters and Colloids, VCH, Weinheim, 1994; D. F. Shriver, D. H. Kaesz, R. D. Adams, The Chemistry of Metal Cluster Complexes, VCH, Weinheim, 1990).

Figure 2:
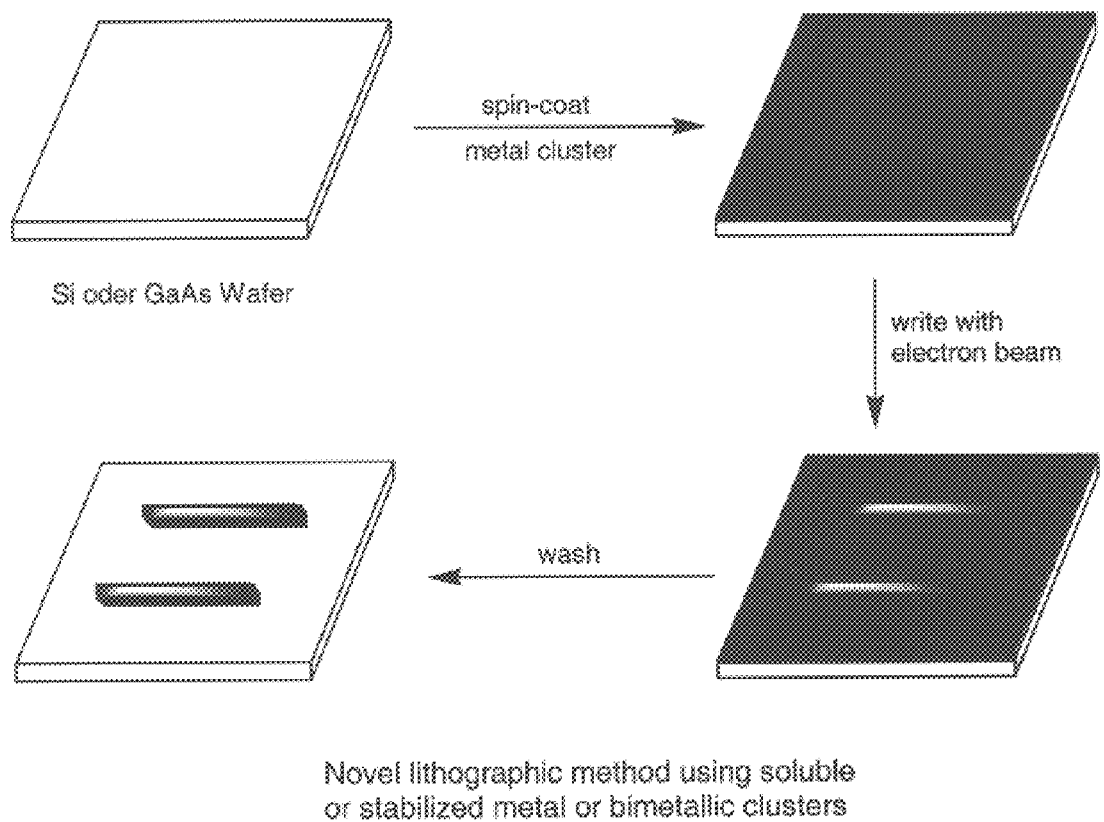
FIG. 2 is a drawing depicting an embodiment of the present invention.
Figure 3:
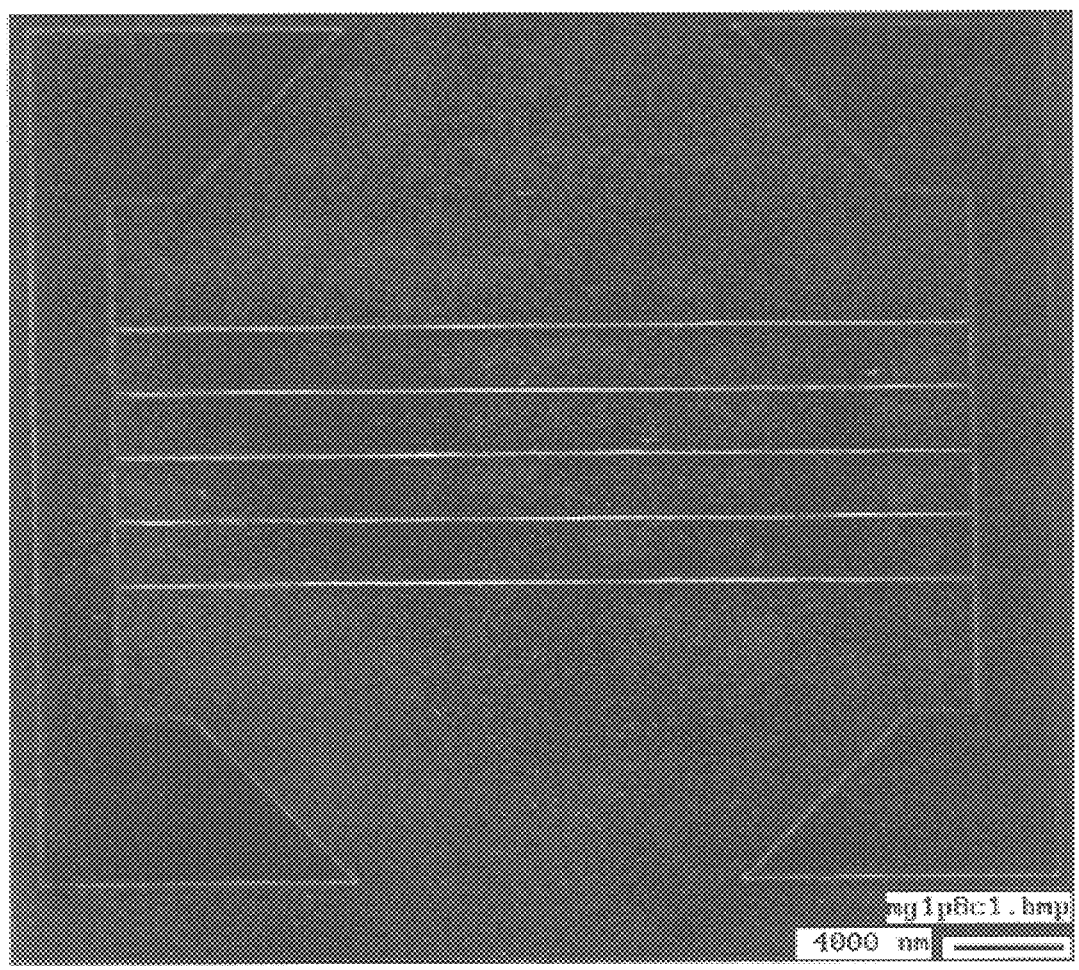
FIG. 3 is a scanning electron micrograph of conductor tracks with contacts.
Figure 4:
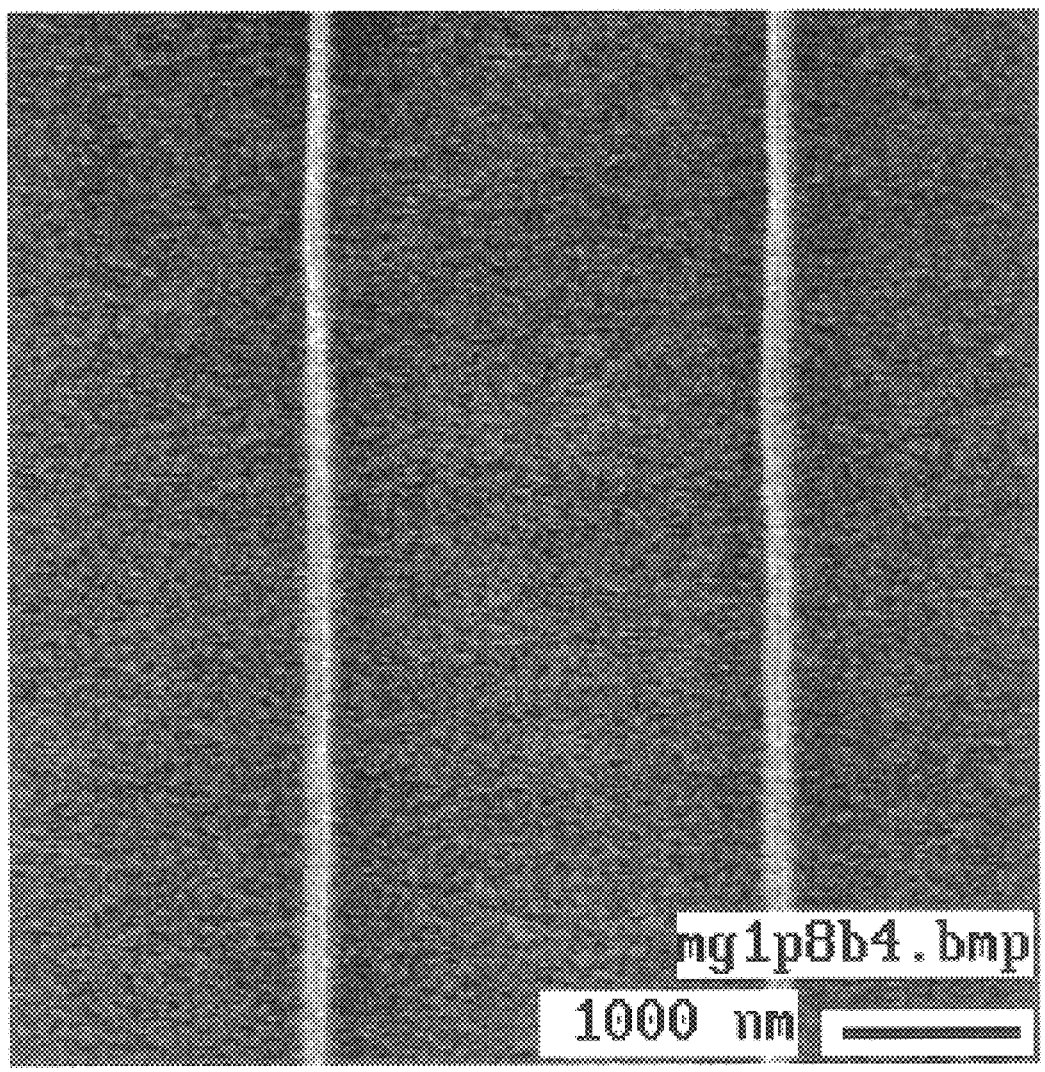
FIG. 4 is a scanning electron micrograph of two conductor tracks.
Figure 5:
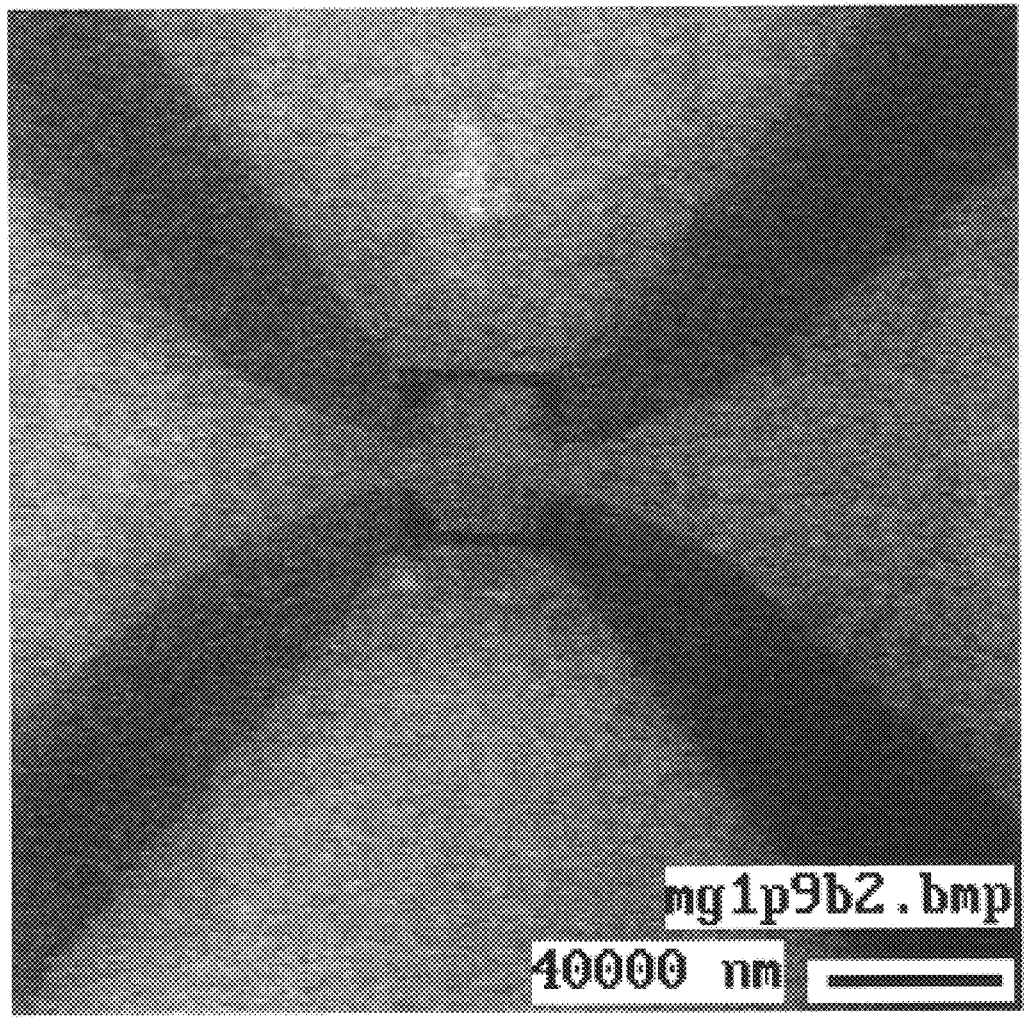
FIG. 5 is a scanning electron micrograph of a conductivity sample with large contacts for conductivity measurement.
Figure 6:
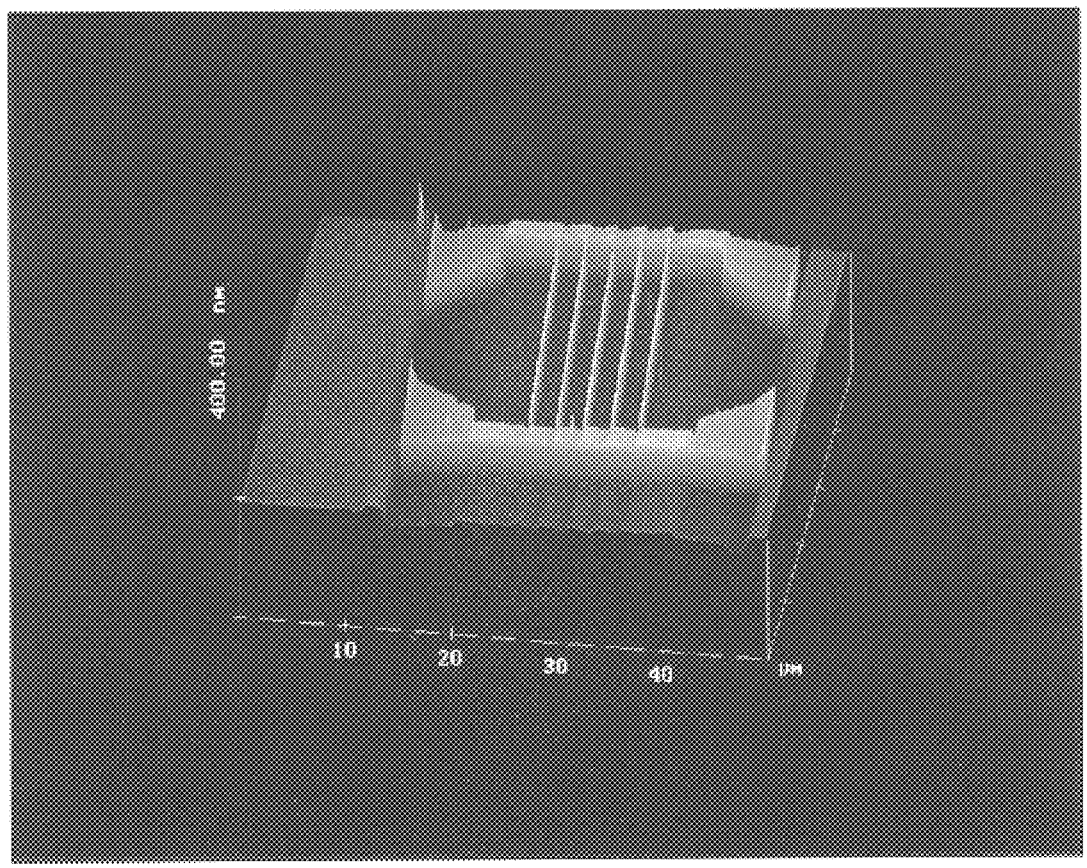
FIG. 6 is an atomic force micrograph of conductor tracks with contacts.

According to the present invention, solutions of such metal or bimetallic clusters or colloids with particle sizes ranging from 0.3 to 200 nm are first coated on a surface in the form of a thin film, e.g., by spin-coating on gallium arsenide (GaAs) or silicon (Si) wafers (chips). Then, the metal colloid containing film is exposed using photo-, ion beam, X-ray or electron beam lithography, preferably electron beam lithography, so that the metal nuclei of the stabilized colloids agglomerate in the exposed areas to form a pattern with concomitant loss of the organic stabilizer. The geometry of the patterns or structures on the surface is determined or defined by the computer-controlled lithographic procedure. The elevation of the structures is determined, inter alia, by the amount of spin-coated clusters, or the layer thickness of the film. The cluster film at the unexposed areas and any stabilizer or residues from the stabilizer on the wafer are then removed in a simple washing process, e.g., by washing with the solvent which was used in the spin-coating of the metal cluster. What remains is the metallic or bimetallic nanostructures (lines or dots). The method is schematically represented in FIG. 2.

Surprisingly, clearly defined structures are generated in the nanometer range having astonishingly sharp profiles. The width and elevation of the lines can be conveniently adjusted within a range of from 10 nm to 500 $\mu$m. The length can be varied between 10 nm and 2 cm. Dots or columns can also be generated (diameter: 10 nm to 300 $\mu$m; elevation: 10 nm to 500 $\mu$m). A further surprising finding is that the conductivity of the metal structures (e.g., lines) assumes or approximates the maximum theoretical value in relevant cases.

In the case of tetraalkylammonium or -phosphonium salt stabilized metal and bimetallic clusters, virtually all members described in the literature can be employed [M. T. Reetz, W. Helbig, J. Am. Chem. Soc. 116 (1994) 7401; M. T. Reetz, W. Helbig, S. A. Quaiser, Chem. Mater. 7 (1995) 2227; M. T. Reetz, S. A. Quaiser, Angew. Chem. 107 (1995) 2461; Angew. Chem. Int. Ed. Engl. 34 (1995) 2240; see above EP-A-0 672 765; H. Bönnemann, in Active Metals: Preparation, Characterization, Applications (A. Fürstner, ed.), VCH, Weinheim, 1996; see above PCT WO 92/18246].

The nature of the ammonium or phosphonium salt, $R_4N^+X^-$ or $R_4P^+X^-$, can be any of a wide variety. Typical representatives are described in Patent Applications EP-A-0 672 765 and PCT WO 92/18246. Tetrabutyl- or tetraoctyl-ammonium chloride, bromide or acetate are preferably used. The metals may also be any of a wide variety; thus, for example, the metals and metal alloys described in Patent Applications EP-A-0 672 765 and PCT WO 92/18246 can be used. Typical metals in the form of $R_4N^+X^-$ or $R_4P^+X^-$ stabilized clusters are those of groups 4, 5, 6, 7, 8, 9, 10 and 11 (group numbering according to IUPAC rules 1989), especially Ti, Mo, Fe, Ru, Co, Rh, Ni, Pd, Pt, Cu, Ag and Au. Typical bimetallic combinations are Pd/Pt, Pt/Sn, Pd/Cu, Pd/Ni and Fe/Co.

The solvents used in the spin-coating of the clusters include those commonly used in chemistry, such as THF, toluene, acetone, dimethylformamide, ethanol and water. Colloid solutions in THF are preferably used.

In the case of polymer stabilized metal clusters as well, a rather wide variety of representatives can be selected as precursors according to the invention, e.g., those mentioned in the monograph by G. Schmid (Clusters and Colloids, VCH, Weinheim, 1994). Polyvinylpyrrolidone or polyethylene glycole stabilized Pd, Pt, Cu, Fe or Au clusters and Pd/Pt or Pd/Cu bimetallic clusters are preferably used.

In the case of ligand-stabilized metal clusters (G. Schmid, Clusters and Colloids, VCH, Weinheim, 1994) as well, a rather wide variety of representatives can be selected according to the invention. These include phosphane stabilized clusters of metals such as Pd, Rh, Cu or Au, phosphanes such as triphenylphosphane being preferably used. Much the same applies to phenanthroline stabilized metal clusters the preparation of which has also been described by G. Schmid (G. Schmid, Clusters and Colloids, VCH, Weinheim, 1994). Defined polynuclear metal carbonyl clusters (G. Schmid, Clusters and Colloids, VCH, Weinheim, 1994) may also be employed according to the present invention. Typical representatives are $[Ir_6(CO)_{15}][(CH_3)_4N]_2$, $Co_4(CO)_{12}$, $[Ni_6(CO)_{12}][(C_4H_9)_4N]_2$, $Ni_8(\mu^4\text{-PPh})_6(CO)_8$, $[Pt_6(CO)_{12}][(C_4H_9)_4N]_2$, $[Pt_{24}(CO)_{30}][(C_4H_9)_4N]_2$, $[Fe_4Cu_5(CO)_{16}][(C_8H_{17})_4N]_3$ and $[Rh_{18}Pt_4(CO)_{35}][(C_8H_{17})_4N]_4$, the syntheses of which are described in detail in the literature (G. Schmid, Clusters and Colloids, VCH, Weinheim, 1994).

Defined metal cluster complexes with bridges consisting of main group elements such as nitrogen, sulfur, selenium and/or phosphorus are also suitable precursors. Typical examples are $[Cu_{12}(PPh)_6(PPh_3)_6]$, $[Co_4Se_4(PtBu_3)_4]$, $[Ni_8S_5(PPh_3)_7]$, $[Pd_8Se_8(PPh_3)_8]$, $[Cu_{26}Te_{16}(PtBu_3)_{10}]$ and $[(CpMo)_3Mo(CO)_3Se_4]^+$ $[CpMo(CO)_3]^-$, the syntheses of which are described in G. Schmid, Clusters and Colloids, VCH, Weinheim, 1994, and D. F. Shriver, D. H. Kaesz, R. D. Adams, The Chemistry of Metal Cluster Complexes, VCH, Weinheim, 1990).

In addition to the nature of the metal, the stabilizer shell or the ligand, and the solvent, the size of the metal and bimetallic clusters may also be varied. Its range is typically from 0.3 to 200 nm; metal or bimetallic clusters with sizes of from 0.5 to 10 nm are preferably used. In the case of defined metal carbonyl clusters and defined cluster complexes, the size of the cluster is determined by its respective geometry (often established by X-ray crystallography in the literature).

Various substrates can serve as the surface, such as Si or GaAs wafers or metal oxide materials with smooth surfaces, such as $SnO_2$. Si or GaAs wafers are preferably used. The surface area may be between 0.05 and 4 $cm^2$, preferably from 0.1 to 1 $cm^2$.

The films containing the metal clusters can be coated on the surface by various methods. These include electrophoretic methods, Langmuir-Blodgett methods and simple spin-coating, with spin-coating being preferably selected.

The layer thickness of the spin-coated cluster or colloid containing films can vary from 0.3 nm to 2 $\mu$m. When particularly small structures are generated, this range is mostly from 5 nm to 200 nm.

Generating the structures requires exposure with an energy beam wherein photo-, ion beam, X-ray or electron beam lithography can be used. Electron beam lithography is preferred wherein various equipments can be used, especially the modern or high-resolution scanning electron microscopes described in the literature.

The washing off of the unexposed cluster or colloid is effected with solvents such as THF, toluene, dimethylformamide, ethanol, acetone or water, preferably with THF or ethanol, optionally in an ultrasonic bath.

The wafers provided with metal patterns can be subjected to a thermal aftertreatment, if required, e.g., by heating in a range of from 150° C. to 400° C., preferably at 180 to 200° C., which will not cause the written patterns to collapse. This treatment may be performed with or without an $H_2$ flow and serves for further cleaning and further removal of organic residues.

The thickness of the written patterns (lines or dots) depends on various factors which can be influenced in a well-aimed manner. These include the metal content of the cluster, the thickness of the spin-coated cluster or colloid film, and the nature of the energy beam in the exposing process. The dosage of the electron beam ($\mu C/cm^2$) must be adapted to the spin-coated material and the layer thickness in order to avoid under- or overexposing. An overexposure will produce blurred and broadened patterns.

Further, the lithographic process can be designed in such a way that, e.g., the electron beam first draws a line in a defined direction and then writes a second, parallel line in close proximity to the first. This creates a broader line (or a broader pattern), and this process can be repeated as often as desired to create broad patterns. In order to achieve the opposite, namely to create lines as thin as possible, the writing may only be performed once in one direction. The higher the resolution of the equipment or the scanning electron microscope, the smaller the structures created.

The advantages of the invention include:
1. Submicron-sized patterns, i.e., nanostructures, can be prepared on surfaces in a well-aimed manner.
2. A few simple process steps which do not involve a tedious metal vaporization are sufficient.
3. The use of readily prepared metal clusters or colloids the natures and compositions of which can be easily varied widely according to the literature also contributes to an inexpensive process.
4. Bi- or polymetallic structures can be easily prepared using appropriate preformed colloids (alloy structures).
5. By appropriately selecting the metal or metals, the electric and/or magnetic (e.g., ferromagnetic) properties of the lithographically prepared structures can be adjusted in a well-aimed manner.

The lithographic process herein described may also be applied to nanostructured metal oxide and metal sulfide clusters or colloids. For example, if soluble cobalt(II) oxide clusters in THF solution are spin-coated onto surfaces and the thus generated film is subjected to an electron beam, defined structures in the nanometer range are produced. Much the same applies if nanostructured metal sulfides, such as CdS, are used as precursors.

The materials produced according to the invention can be used in various fields, i.e., in such cases where lithographic processes are involved in the preparation of application-relevant products. This includes, e.g., the preparation of integrated circuits in computer chip technology, the production of magnetic devices for magnetic data carriers or storage media, and the manufacture of microsensors. The materials produced according to the invention are directly employed as components, even in the production of quantum dots and quantum wires (E. Corcoran, Spektrum der Wissenschaft 1991, 76). However, they may also be used indirectly, e.g., as punches or masks in the multiple production of devices or components in microelectronics or sensory analysis. Thus, for example, the patterned surfaces produced according to the invention may be used as punches, which is a simple alternative to the preparation of conventional punches which are used in the multiple production of devices in microelectronics, as is well-known [e.g., microcontact printing according to G. M. Whitesides et al., Adv. Materials 7 (1995) 471]. The materials prepared according to the invention may also be used as a mask or template in the multiple production of nanometer-sized patterns within the scope of the so-called imprint lithography [S. Y. Chou, P. R. Krauss, P. J. Renstrom, Science 272 (1996) 85].

EXAMPLE 1

Preparation of Palladium Conductor Tracks Using 2 nm Colloids or Clusters (68.80% Pd)

Under clean room conditions, a solution of 150 mg of palladium/tetraoctylammonium bromide (elemental analysis: 68.80% Pd, the remaining 31.2% consists of tetraoctylammonium bromide which acts as a stabilizer to protect the particles from undesired agglomeration) in 1 ml of tetrahydrofuran is first prepared. The particle size of the colloids as determined by TEM is about 2 nm with spherical geometry. On GaAs substrates (3.9·3.9·0.5 mm) preliminarily cleaned in acetone in an ultrasonic bath, a colloid film is then generated by spin-coating. To this end, 35 $\mu$l of possibly freshly filtered colloid solution (filtration through 200 nm Teflon filter) is dropped onto the GaAs wafer, and the spin-coating process is started with the following parameters: rotational acceleration 4500 rpm/s, rotational speed 9000 rpm, duration 15 s. AFM examinations show that the colloid film formed has a thickness of 163 nm and an average roughness of <1 nm. The writing process is performed by placing the GaAs wafer in an electron microscope and exposing the colloid film with the electron beam. As the layout, a pattern is selected consisting of five 20 nm wide, 31 $\mu$m long parallel conductor tracks the ends of which are interconnected by contact strips. The exposure of the GaAs wafer is effected in the high magnification mode of the electron microscope, respectively with the following doses: D=100,000 $\mu C/cm^2$, D=200,000 $\mu C/cm^2$, D=300,000 $\mu C/cm^2$, the contact strips being exposed with only 10% of the given doses, respectively. AFM examinations of the samples show that the dose D=200,000 $\mu C/cm^2$ provided the best result, the thickness of the colloid film decreasing by 5 nm at the exposed areas. For better contactability, large contacts for a four-point conductibility measurement are written to this pattern onto the colloid film with D=4000 $\mu C/cm^2$ in the low magnification mode. The processing of the pattern is performed by simple washing of the GaAs wafer with tetrahydrofuran in an ultrasonic bath. Due to the redispersibility of the Pd colloid, the unexposed colloid film is washed off, and the exposed areas remain. An AFM examination shows that conductor tracks of 30.662 $\mu m$ length, 147 nm width and 85 nm elevation with related contacts have been written. Four-point measurements on these conductor tracks yield R=203$\Omega/\square$, $\rho$=1725.5 $\mu\Omega\cdot cm$. To improve the conductivity, the GaAs wafer is subsequently annealed at 185° C. and p=1 mbar for 120 min. This reduces the thickness of the pattern to 65 nm with the lateral dimensions being retained. The resistivity is found to be R=27$\Omega/\square$, $\rho$=175.5 $\mu\Omega\cdot cm$. The following FIGS. 3 to 6 show the results of the scanning electron microscopic and atomic force microscopic examinations.

EXAMPLE 2

Preparation of Palladium Conductor Tracks Using 2 nm Colloids or Clusters (33.82% Pd)

Figure 7:
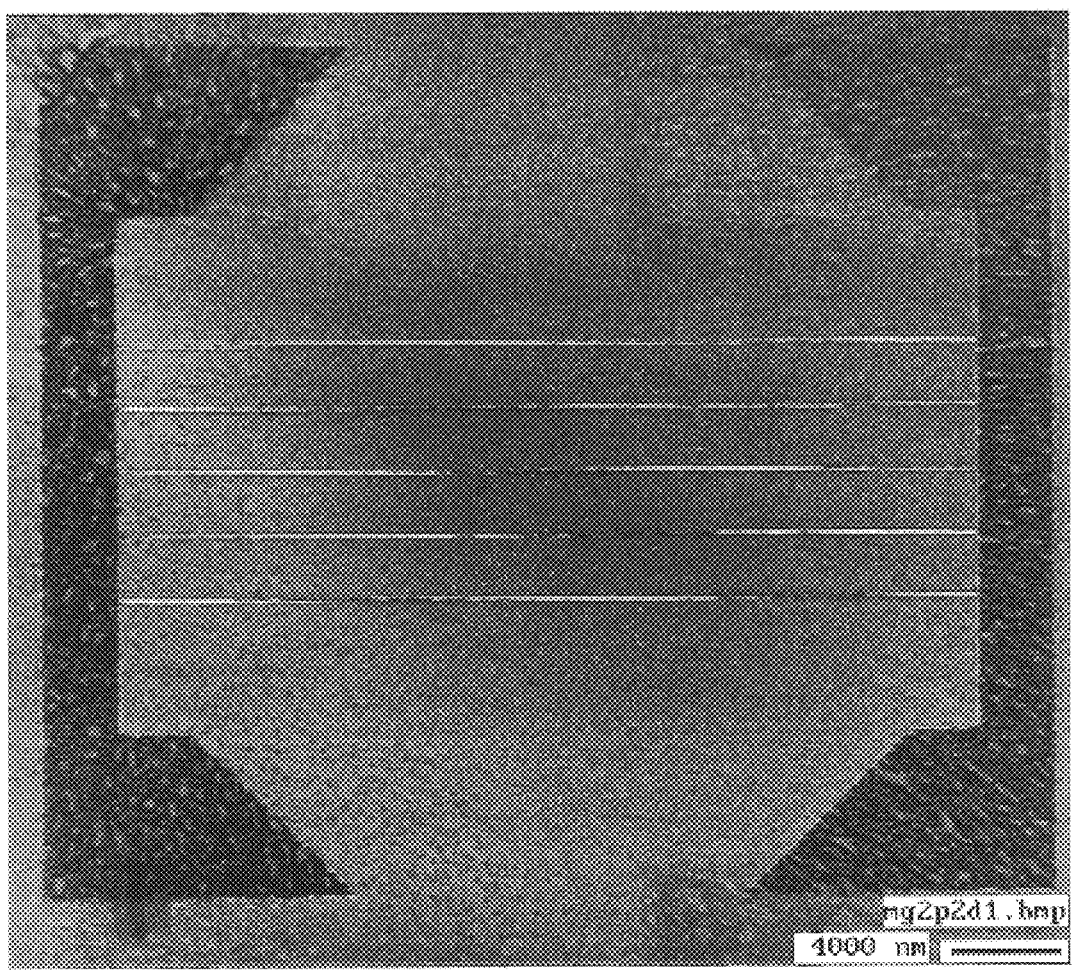
FIG. 7 is another scanning electron micrograph of conductor tracks with contacts.
Figure 8:
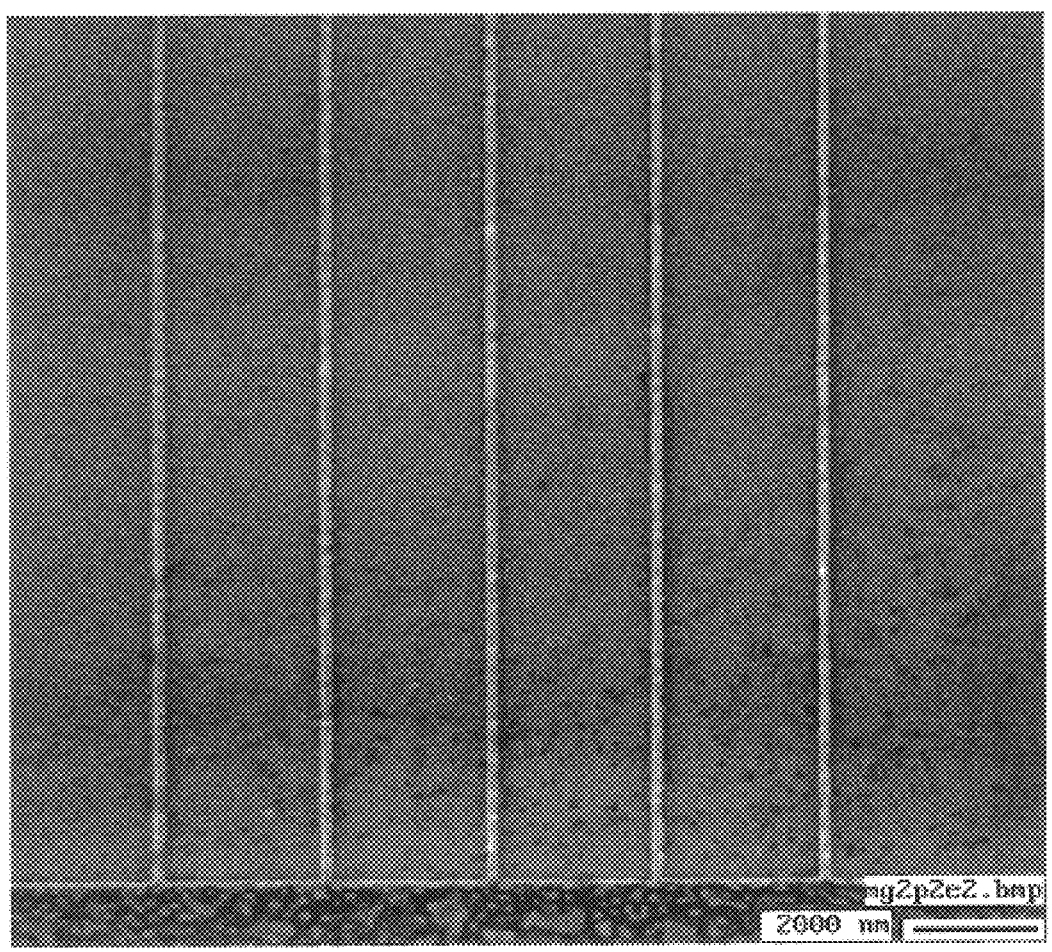
FIG. 8 is a scanning electron micrograph of five conductor tracks.
Figure 9:
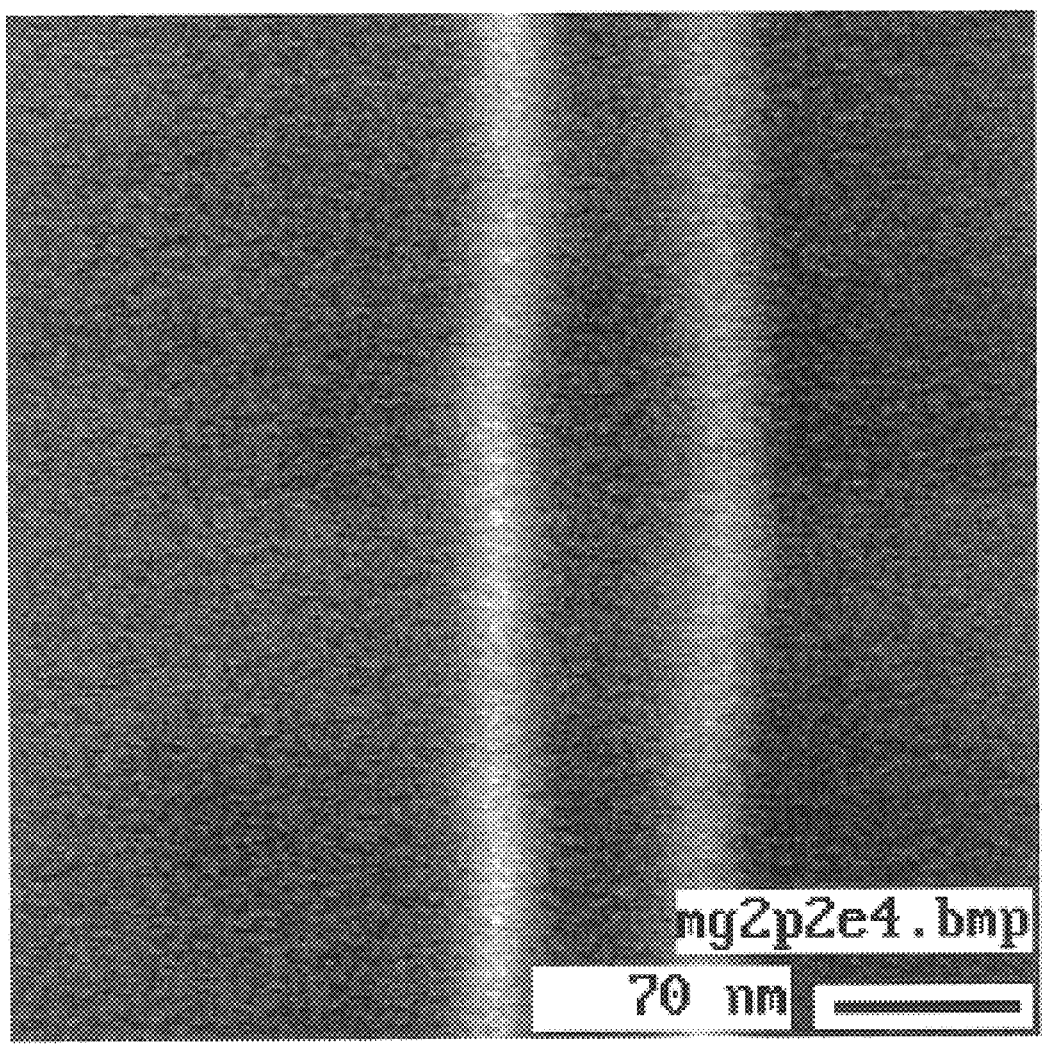
FIG. 9 is a scanning electron micrograph of one conductor track.

Under clean room conditions, a solution of 67 mg of palladium/tetraoctylammonium bromide (elemental analysis: 33.82% Pd, the remaining 66.18% consists of tetraoctylammonium bromide which acts as a stabilizer to protect the particles from undesired agglomeration) in 1 ml of tetrahydrofuran is first prepared. The particle size of the colloids as determined by TEM is about 2 nm with spherical geometry. On GaAs substrates (3.9·3.9·0.5 mm) preliminarily cleaned in acetone in an ultrasonic bath, a colloid film is then generated by spin-coating. To this end, 35 $\mu l$ of possibly freshly filtered colloid solution (filtration through 200 nm Teflon filter) is dropped onto the GaAs wafer, and the spin-coating process is started with the following parameters: rotational acceleration 20,000 rpm/s, rotational speed 7000 rpm, duration 20 s. The writing process is performed by placing the GaAs wafer in an electron microscope and exposing the colloid film with the electron beam. As the layout, a pattern is selected consisting of five 20 nm wide, 31 $\mu m$ long parallel conductor tracks the ends of which are interconnected by contact strips. The exposure of the GaAs wafer is effected in the high magnification mode of the electron microscope, respectively with the following doses: D=400,000 $\mu C/cm^2$, D=600,000 $\mu C/cm^2$, D=800,000 $\mu C/cm^2$, the contact strips being exposed with only 10% of the given doses, respectively. AFM examinations of the samples show th at the dose D=600,000 $\mu C/cm^2$ provided the best result. For better contactability, large contacts for a four-point conductibility measurement are written to this pattern onto the colloid film with D=14000 $\mu C/cm^2$ in the low magnification mode. The processing of the pattern is performed by simple washing of the GaAs wafer with tetrahydrofuran in an ultrasonic bath. Due to the redispersibility of the Pd colloid, the unexposed colloid film is washed off, and the exposed areas remain. An AFM examination shows that conductor tracks of 31.736 $\mu m$ length, 80 nm width and 70 nm elevation with related contacts have been written. Four-point measurements on these conductor tracks yield R=8.6 k$\Omega/\square$, $\rho$=60.2 m$\Omega\cdot cm$. To improve the conductivity, the GaAs wafer is subsequently annealed at 185° C. and p=1 mbar for 120 min. This reduces the thickness of the pattern to 54 nm with the lateral dimensions being retained. The resistivity is found to be R=53 $\Omega/\square$, $\rho$=283.7 $\mu\Omega\cdot cm$. The annealing may also be performed in an H$_2$ flow. FIGS. 7, 8 and 9 show the corresponding scanning electron micrographs.

EXAMPLE 3

Preparation of Palladium Conductor Tracks Using 6 nm Colloids or Clusters (46.00% Pd)

Figure 10:
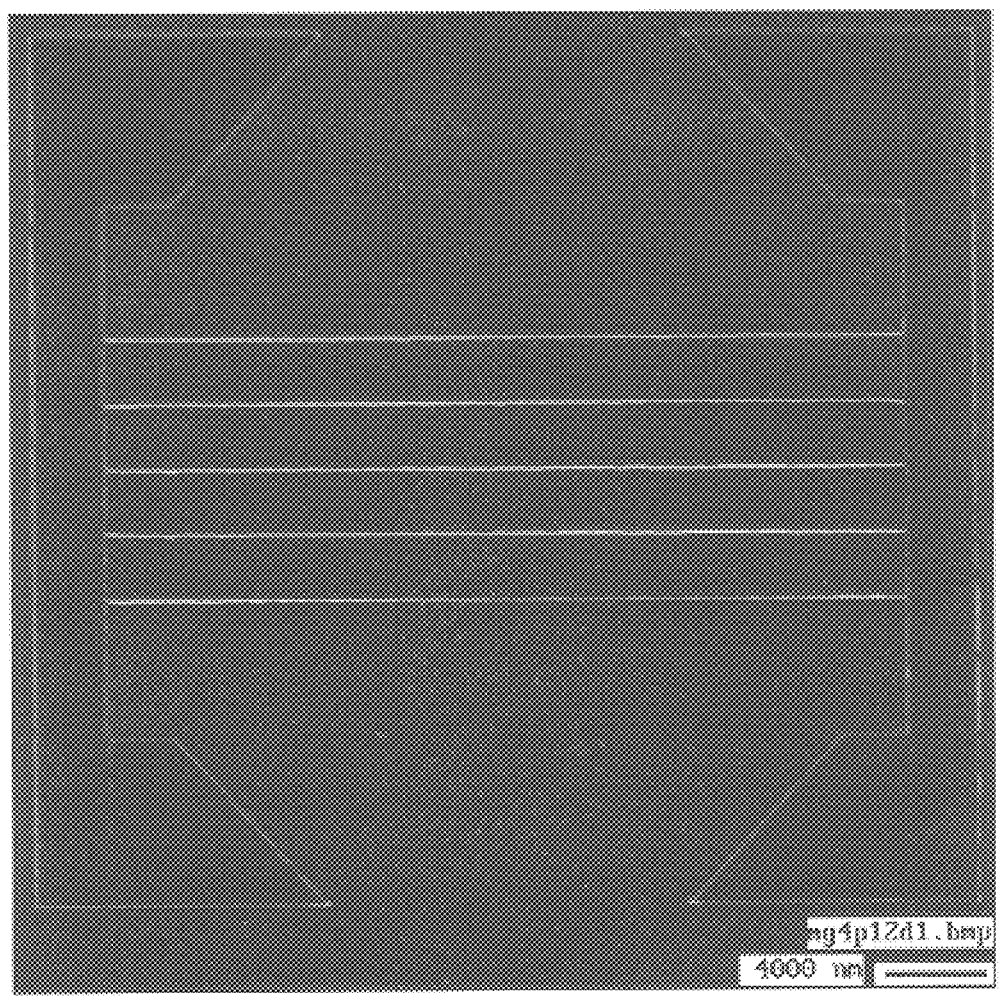
FIG. 10 is a scanning electron micrograph of conductor tracks with contacts.
Figure 11:
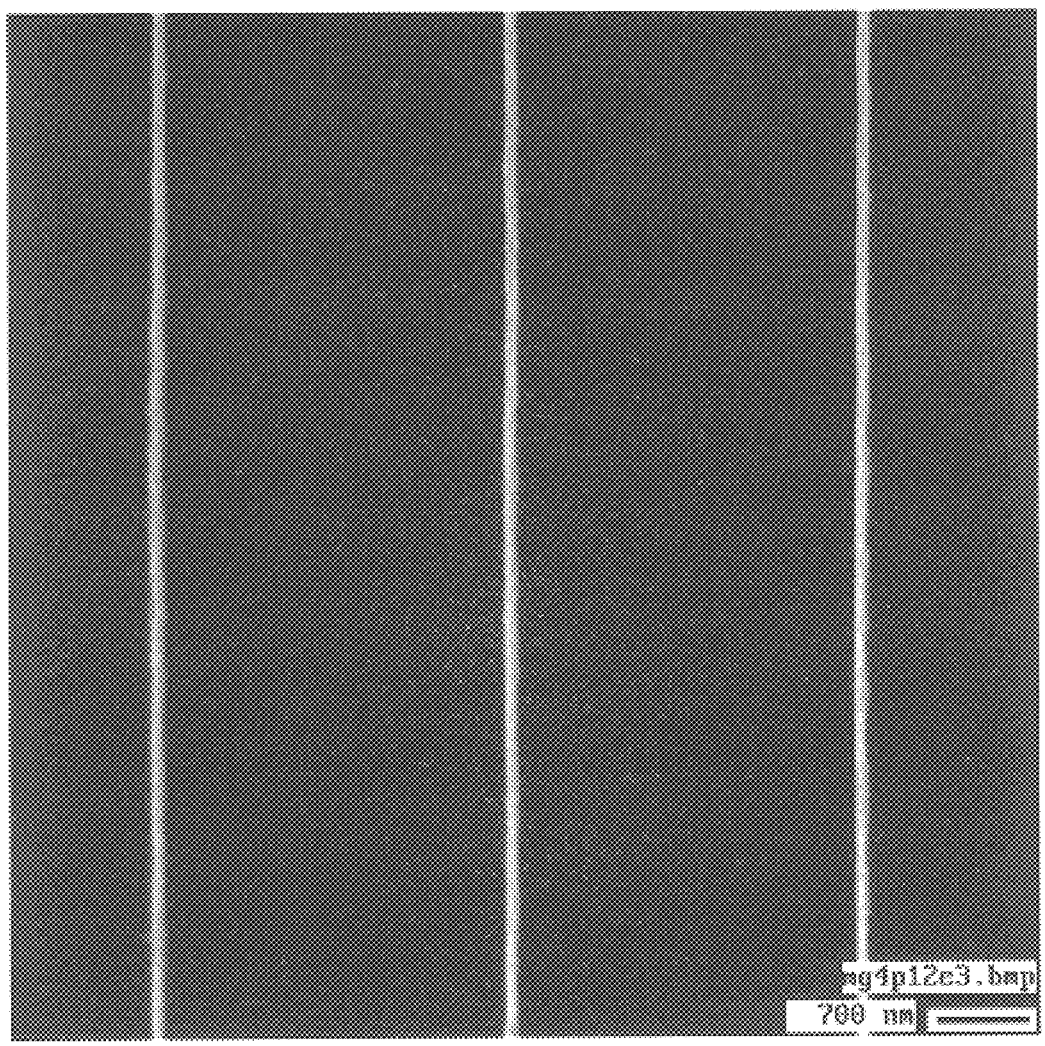
FIG. 11 is a scanning electron micrograph of three conductor tracks.
Figure 12:
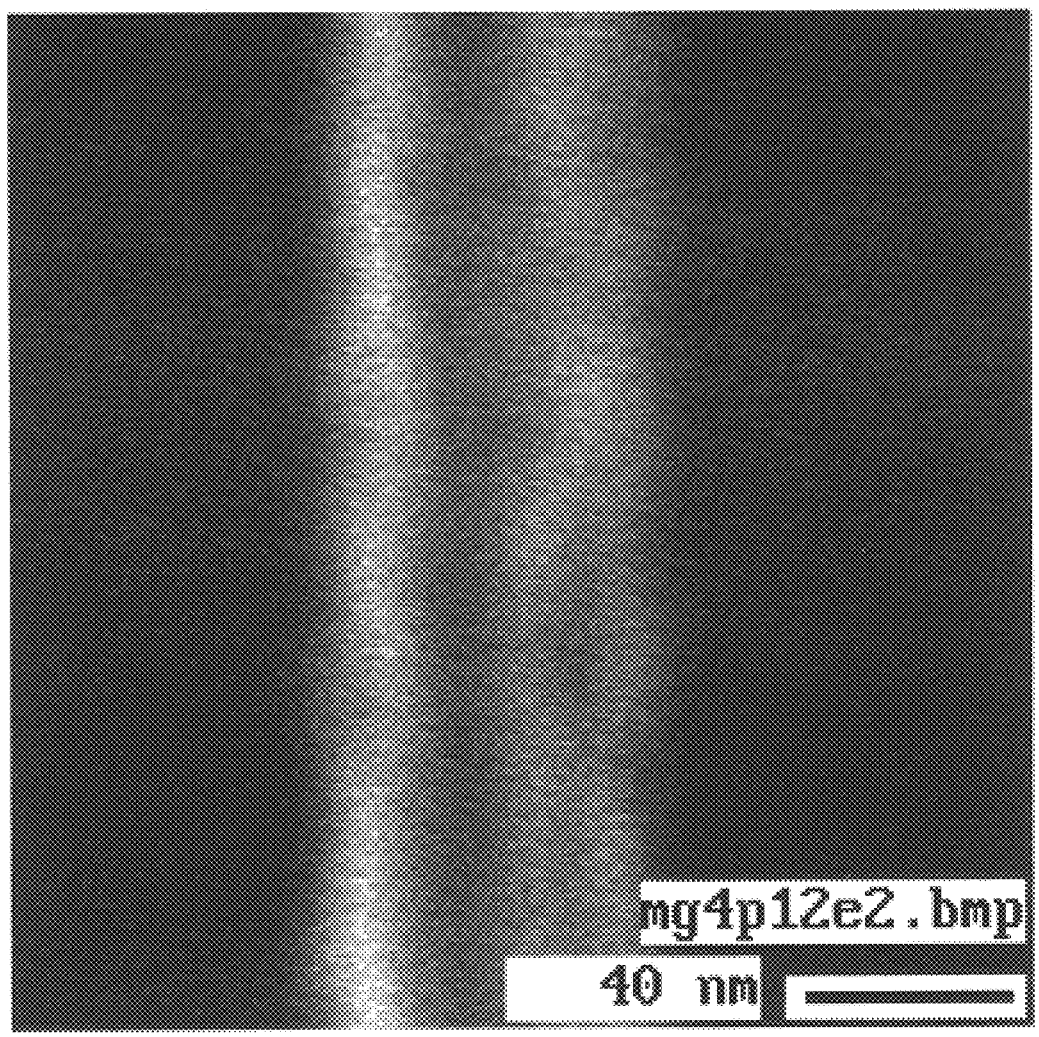
FIG. 12 is another scanning electron micrograph of one conductor track.
Figure 13:
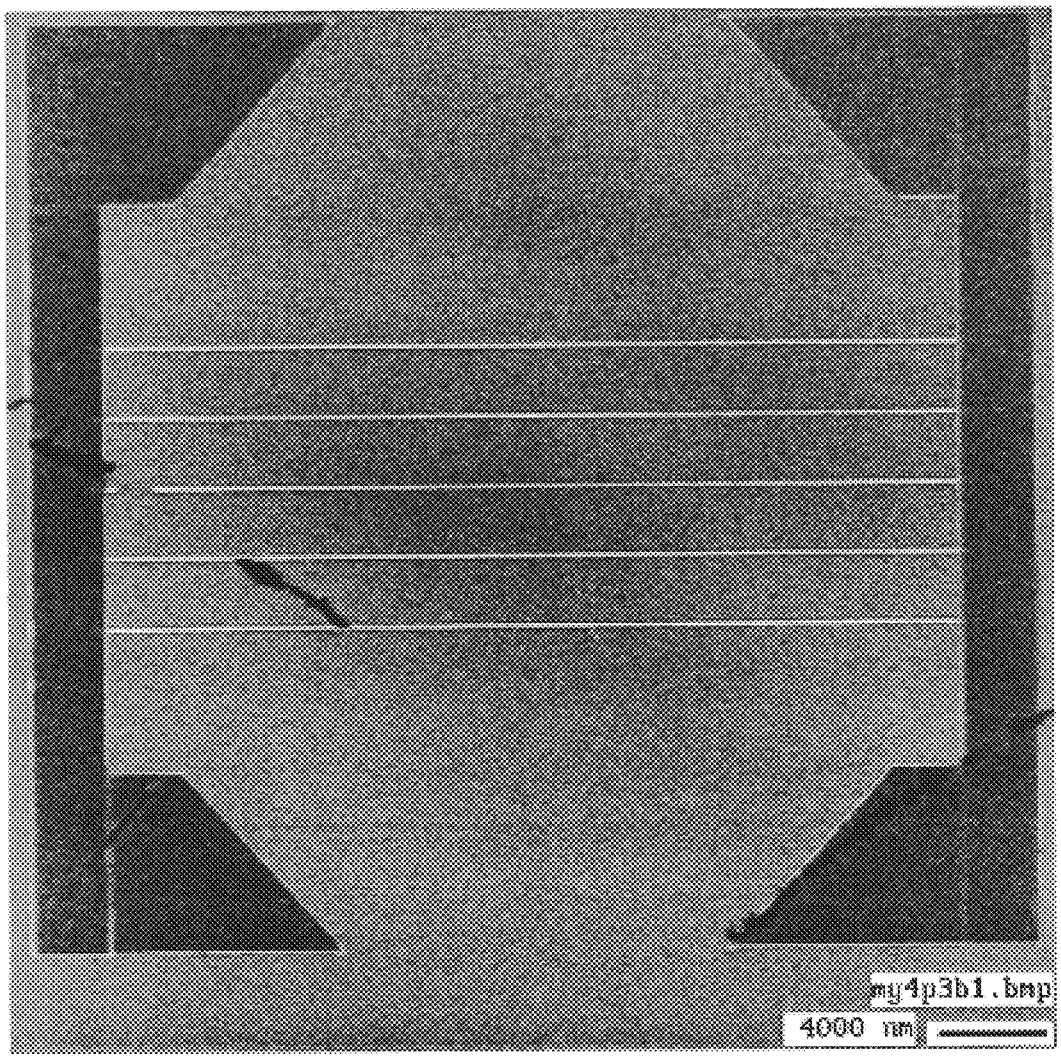
FIG. 13 is another scanning electron micrograph of conductor tracks with contacts.
Figure 14:
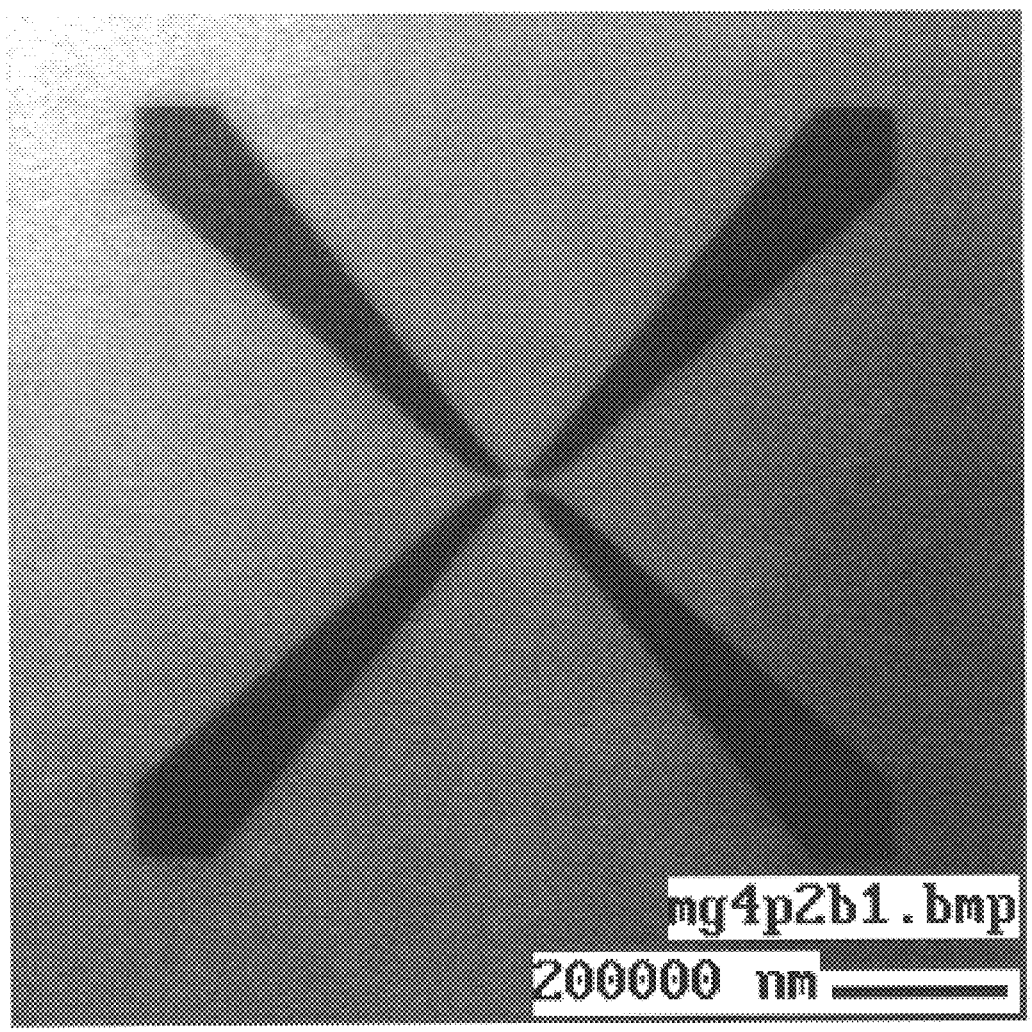
FIG. 14 is another scanning electron micrograph of a conductivity sample with large contacts.
Figure 15:
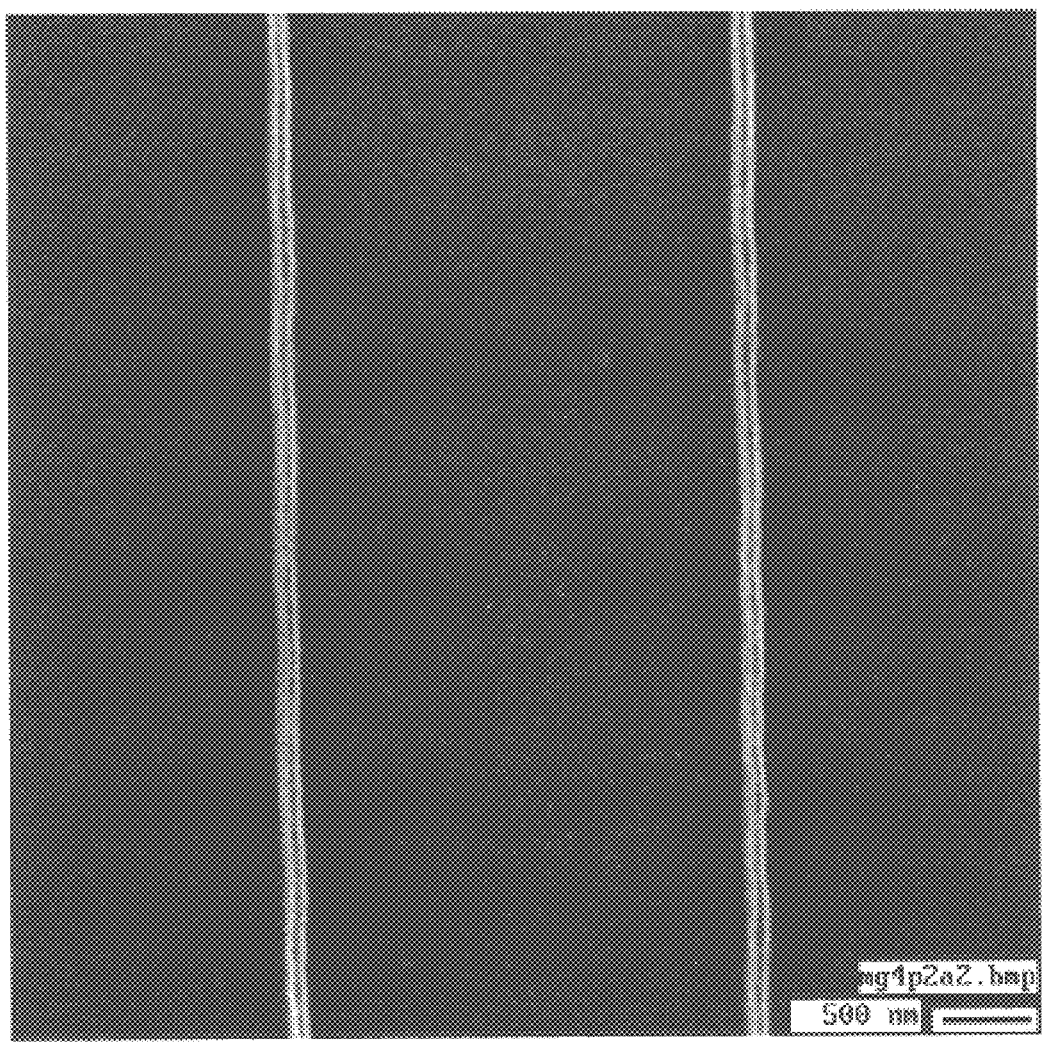
FIG. 15 is another scanning electron micrograph of two conductor tracks.
Figure 16:
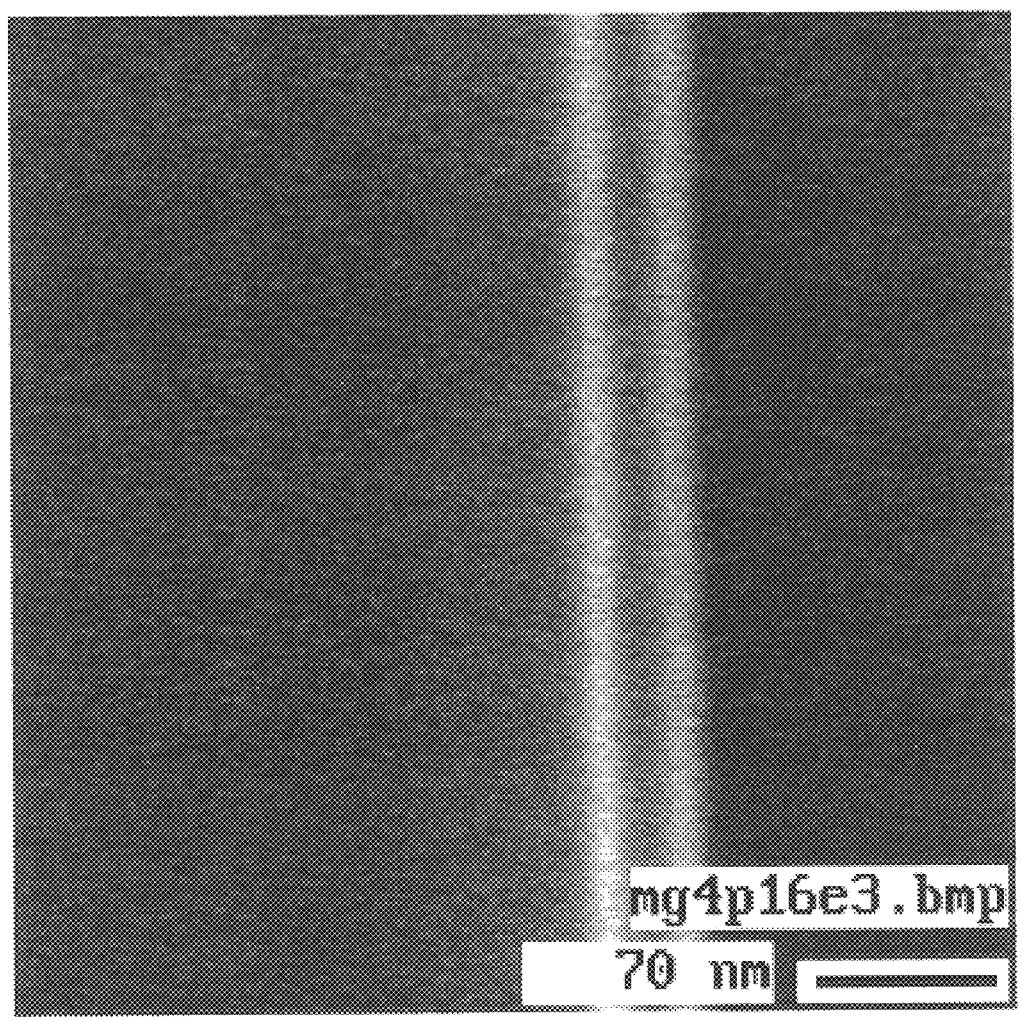
FIG. 16 is another scanning electron micrograph of one conductor track.

Under clean room conditions, a solution of 150 mg of palladium/tetraoctylammonium bromide (elemental analysis: 46.00% Pd, the remaining 54.00% consists of tetraoctylammonium bromide which acts as a stabilizer to protect the particles from undesired agglomeration) in 1 ml of tetrahydrofuran is first prepared. The particle size of the colloids as determined by TEM is about 6 nm with spherical geometry. On GaAs substrates (3.9·3.9·0.5 mm) preliminarily cleaned in acetone in an ultrasonic bath, a colloid film is then generated by spin-coating. To this end, 35 $\mu l$ of possibly freshly filtered colloid solution (filtration through 200 nm Teflon filter) is dropped onto the GaAs wafer, and the spin-coating process is started with the following parameters: rotational acceleration 20,000 rpm/s, rotational speed 9000 rpm, duration 30 s. The writing process is performed by placing the GaAs wafer in an electron microscope and exposing the colloid film with the electron beam. As the layout, a pattern is selected consisting of five 20 nm wide, 31 $\mu m$ long parallel conductor tracks the ends of which are interconnected by contact strips. The exposure of the GaAs wafer is effected in the high magnification mode of the electron microscope, respectively with the following doses: D=100,000 $\mu C/cm^2$, D=200,000 $\mu C/cm^2$, D=400,000 $\mu C/cm^2$, D=600,000 $\mu C/cm^2$, D=800,000 $\mu C/cm^2$, the contact strips being exposed with only 10% of the given doses, respectively. AFM examinations of the samples show that the dose D=600,000 $\mu C/cm^2$ provided the best result. For better contactability, large contacts for a four-point conductibility measurement are written to this pattern onto the colloid film with D=14000 $\mu C/cm^2$ in the low magnification mode. The processing of the pattern is performed by simple washing of the GaAs wafer with tetrahydrofuran in an ultrasonic bath. Due to the redispersibility of the Pd colloid, the unexposed colloid film is washed off, and the exposed areas remain. An AFM examination shows that conductor tracks of 31.966 $\mu m$ length, 40 nm width and 170 nm elevation with related contacts have been written. Four-point measurements on these conductor tracks yield R=8071 $\Omega/\square$, $\rho$=137,207 $\mu\Omega\cdot cm$. To improve the conductivity, the GaAs wafer is subsequently annealed at 185° C. and p=1 mbar for 120 min. This reduces the thickness of the pattern to 130 nm with the lateral dimensions being retained. The resistivity is found to be R=5 $\Omega/\square$, $\rho$=65 $\mu\Omega\cdot cm$. FIGS. 10, 11 and 12 show the corresponding scanning electron micrographs.

EXAMPLE 4

Preparation of Palladium/Platinum Conductor Tracks Using 2 nm Bimetallic Colloids or Bimetallic Clusters (27.12% Pd, 17.85% Pt)

Under clean room conditions, a solution of 150 mg of palladium/platinum tetraoctylammonium bromide (elemental analysis: 27.12% Pd, 17.85% Pt; the remaining 54.00% consists of tetraoctylammonium bromide which acts as a stabilizer to protect the particles from undesired agglomeration) in 1 ml of tetrahydrofuran is first prepared. The particle size of the colloids as determined by TEM is about 6 nm with spherical geometry. EDX spot analyses show that almost all colloid particles contain both metals. On GaAs substrates (3.9·3.9·0.5 mm) preliminarily cleaned in acetone in an ultrasonic bath, a colloid film is then generated by spin-coating. To this end, 35 µl of possibly freshly filtered colloid solution (filtration through 200 nm Teflon filter) is dropped onto the GaAs wafer, and the spin-coating process is started with the following parameters: rotational acceleration 20,000 rpm/s, rotational speed 9000 rpm, duration 30 s. The writing process is performed by placing the GaAs wafer in an electron microscope and exposing the colloid film with the electron beam. As the layout, a pattern is selected consisting of five 20 nm wide, 31 µm long parallel conductor tracks the ends of which are interconnected by contact strips. The exposure of the GaAs wafer is effected in the high magnification mode of the electron microscope, respectively with the following doses: D=400,000 µC/cm$^2$, D=600,000 µC/cm$^2$, D=800,000 µC/cm$^2$, the contact strips being exposed with only 10% of the given doses, respectively. AFM examinations of the samples show that the dose D=800,000 µC/cm$^2$ provided the best result. For better contactability, large contacts for a four-point conductibility measurement are written to this pattern onto the colloid film with D=36000 µC/cm$^2$ in the low magnification mode. The processing of the pattern is performed by simple washing of the GaAs wafer with tetrahydrofuran in an ultrasonic bath. Due to the redispersibility of the Pd/Pt colloid, the unexposed colloid film is washed off, and the exposed areas remain. An AFM examination shows that conductor tracks of 31.812 µm length, 61 nm width and 54 nm elevation with related contacts have been written. Four-point measurements on these conductor tracks yield R=15.014 kΩ/□, ρ=81076.4 µΩ·cm. To improve the conductivity, the GaAs wafer is subsequently annealed at 185° C. and p=1 mbar for 120 min. This reduces the thickness of the pattern to 41 nm with the lateral dimensions being retained. The resistivity is found to be R=16.8 Ω/□, ρ=69.3 µΩ·cm. FIGS. 13 to 16 show the corresponding scanning electron micrographs.

EXAMPLE 5

Preparation of Palladium Conductor Tracks Using 2 nm Colloids or Clusters (6.06% Pd)

Figure 17:
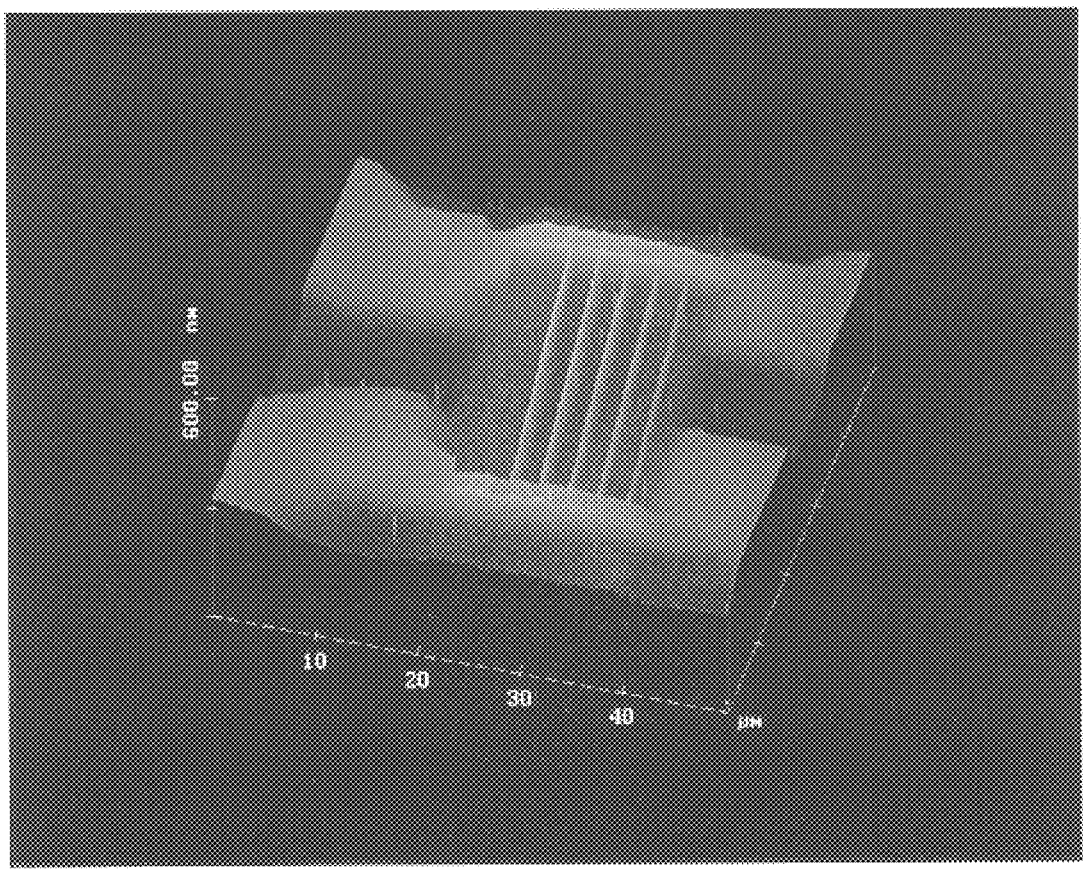
FIG. 17 is another scanning electron micrograph of conductor tracks with contacts.

Under clean room conditions, a solution of 50 mg of palladium/polyvinylpyrrolidone (elemental analysis: 6.06% Pd, the remaining 93.94% consists of polyvinylpyrrolidone which acts as a stabilizer to protect the particles from undesired agglomeration) in 1 ml of dichloromethane is first prepared. The particle size of the colloids as determined by TEM is about 2 nm with spherical geometry. On GaAs substrates (3.9·3.9·0.5 mm) preliminarily cleaned in acetone in an ultrasonic bath, a colloid film is then generated by spin-coating. To this end, 35 µl of possibly freshly filtered colloid solution (filtration through 200 nm Teflon filter) is dropped onto the GaAs wafer, and the spin-coating process is started with the following parameters: rotational acceleration 20,000 rpm/s, rotational speed 9000 rpm, duration 30 s. The writing process is performed by placing the GaAs wafer in an electron microscope and exposing the colloid film with the electron beam. As the layout, a pattern is selected consisting of five 20 nm wide, 31 µm long parallel conductor tracks the ends of which are interconnected by contact strips. The exposure of the GaAs wafer is effected in the high magnification mode of the electron microscope with the following dose: D=18,000 µC/cm$^2$, the contact strips being exposed with only 10% of the given dose. For better contactability, large contacts for a four-point conductibility measurement are written to this pattern onto the colloid film with D=2500 µC/cm$^2$ in the low magnification mode. The processing of the pattern is performed by simple washing of the GaAs wafer with dichloromethane in an ultrasonic bath. Due to the redispersibility of the Pd colloid, the unexposed colloid film is washed off, and the exposed areas remain. An AFM examination shows that conductor tracks of 32.200 µm length, 230 nm width and 94 nm elevation with related contacts have been written. Four-point measurements on these conductor tracks yield R=46.458 kΩ/□, ρ=436708 µΩ·cm. To improve the conductivity, the GaAs wafer is subsequently annealed at 185° C. and p=1 mbar for 120 min. This reduces the thickness of the pattern to 72 nm with the lateral dimensions being retained. The resistivity is found to be R=46.25 Ω/□, ρ=333 µΩ·cm. FIG. 17 shows the atomic force micrograph of the produced conductor tracks with contacts.

EXAMPLE 6

Preparation of Copper Conductor Tracks Using 2 nm Colloids or Clusters (8.21% Cu)

Under clean room conditions, a solution of 50 mg of copper/polyvinylpyrrolidone (elemental analysis: 8.21% Cu, the remaining 91.79% consists of polyvinylpyrrolidone which acts as a stabilizer to protect the particles from undesired agglomeration) in 1 ml of dichloromethane is first prepared. The particle size of the colloids as determined by TEM is about 2 nm with spherical geometry. On GaAs substrates (3.9·3.9·0.5 mm) preliminarily cleaned in acetone in an ultrasonic bath, a colloid film is then generated by spin-coating. To this end, 35 µl of possibly freshly filtered colloid solution (filtration through 200 nm Teflon filter) is dropped onto the GaAs wafer, and the spin-coating process is started with the following parameters: rotational acceleration 10,000 rpm/s, rotational speed 9000 rpm, duration 30 s. The writing process is performed by placing the GaAs wafer in an electron microscope and exposing the colloid film with the electron beam. As the layout, a pattern is selected consisting of five 20 nm wide, 31 µm long parallel conductor tracks the ends of which are interconnected by contact strips. The exposure of the GaAs wafer is effected in the high magnification mode of the electron microscope with the following dose: D=25,000 µC/cm$^2$, the contact strips being exposed with only 10% of the given dose. The processing of the pattern is performed by simple washing of the GaAs wafer with dichloromethane in an ultrasonic bath. Due to the redispersibility of the Cu colloid, the unexposed colloid film is washed off, and the exposed areas remain. An AFM examination shows that conductor tracks of 31.231 µm length, 112 nm width and 53 nm elevation with related contacts have been written.

EXAMPLE 7

Preparation of Cobalt Patterns Using 2 nm Colloids or Clusters (27.59% Co)

Since the metal colloid is highly sensitive to air and moisture, all of the following operations must be performed under protective gas conditions. Under clean room conditions, a solution of 150 mg of cobalt/tetraoctylammonium bromide (elemental analysis: 27.59% Co, the remaining 72.41% consists of tetraoctylammonium bromide which acts as a stabilizer to protect the particles from undesired agglomeration) in 1 ml of tetrahydrofuran is first prepared. The particle size of the colloids as determined by TEM is about 2 nm with spherical geometry. On GaAs substrates (3.9·3.9·0.5 mm) preliminarily cleaned in acetone in an ultrasonic bath, a colloid film is then generated by spin-coating. To this end, 35 µl of possibly freshly filtered colloid solution (filtration through 200 nm Teflon filter) is dropped onto the GaAs wafer, and the spin-coating process is started with the following parameters: rotational acceleration 20,000 rpm/s, rotational speed 9000 rpm, duration 15 s. The writing process is performed by placing the GaAs wafer in an electron microscope and exposing the colloid film with the electron beam. As the layout, a pattern is selected consisting of five 20 nm wide, 31 µm long parallel tracks. The exposure of the GaAs wafer is effected in the high magnification mode of the electron microscope with the following dose: D=600,000 µC/cm². The processing of the pattern is performed by simple washing of the GaAs wafer with dichloromethane in an ultrasonic bath. Due to the redispersibility of the Co colloid, the unexposed colloid film is washed off, and the exposed areas remain. An AFM examination shows that patterns of 31.899 µm length, 54 nm width and 66 nm elevation have been written.

EXAMPLE 8

Preparation of Cobalt Oxide Patterns Using 2.5 nm Colloids or Clusters (21.34% Co)

Since the metal colloid is highly sensitive to air and moisture, all of the following operations must be performed under protective gas conditions. Under clean room conditions, a solution of 150 mg of cobalt oxide/ tetraoctylammonium bromide (elemental analysis: 21.34% Co, the remaining 78.66% consists of tetraoctylammonium bromide which acts as a stabilizer to protect the particles from undesired agglomeration) in 1 ml of tetrahydrofuran is first prepared. The particle size of the colloids as determined by TEM is about 2.5 nm with spherical geometry. On GaAs substrates (3.9·3.9·0.5 mm) preliminarily cleaned in acetone in an ultrasonic bath, a colloid film is then generated by spin-coating. To this end, 35 µl of possibly freshly filtered colloid solution (filtration through 200 nm Teflon filter) is dropped onto the GaAs wafer, and the spin-coating process is started with the following parameters: rotational acceleration 20,000 rpm/s, rotational speed 9000 rpm, duration 15 s. The writing process is performed by placing the GaAs wafer in an electron microscope and exposing the colloid film with the electron beam. As the layout, a pattern is selected consisting of five 20 nm wide, 31 µm long parallel tracks. The exposure of the GaAs wafer is effected in the high magnification mode of the electron microscope with the following dose: D=500,000 µC/cm². The processing of the pattern is performed by simple washing of the GaAs wafer with tetrahydrofuran. Due to the redispersibility of the Co colloid, the unexposed cobalt oxide film is washed off, and the exposed areas remain. Examinations show that patterns of 31.021 µm length, 35 nm width and 71 nm elevation have been written.

EXAMPLE 9

Preparation of Copper/Palladium Patterns Using 2 nm Bimetallic Colloids or Bimetallic Clusters (31.38% Pd, 21.92% Cu)

Since the metal colloid is highly sensitive to air and moisture, all of the following operations must be performed under protective gas conditions. Under clean room conditions, a solution of 150 mg of palladium/copper tetraoctylammonium bromide (elemental analysis: 31.38% Pd, 21.92% Cu; the remaining 46.70% consists of tetraoctylammonium bromide which acts as a stabilizer to protect the particles from undesired agglomeration) in 1 ml of tetrahydrofuran is first prepared. The particle size of the colloids as determined by TEM is about 2 nm with spherical geometry. On GaAs substrates (3.9·3.9·0.5 mm) preliminarily cleaned in acetone in an ultrasonic bath, a colloid film is then generated by spin-coating. To this end, 35 µl of possibly freshly filtered colloid solution (filtration through 200 nm Teflon filter) is dropped onto the GaAs wafer, and the spin-coating process is started with the following parameters: rotational acceleration 20,000 rpm/s, rotational speed 9000 rpm, duration 15 s. The writing process is performed by placing the GaAs wafer in an electron microscope and exposing the colloid film with the electron beam. As the layout, a pattern is selected consisting of five 20 nm wide, 31 µm long parallel tracks. The exposure of the GaAs wafer is effected in the high magnification mode of the electron microscope with the following dose: D=300,000 µC/cm². The processing of the pattern is performed by simple washing of the GaAs wafer with tetrahydrofuran. Due to the redispersibility of the Cu/Pd colloid, the unexposed colloid film is washed off, and the exposed areas remain. Examinations show that patterns of 30.873 µm length, 64 nm width and 36 nm elevation have been written.

EXAMPLE 10

Preparation of Palladium Columns Using 2 nm Colloids or Clusters (68.80% Pd)

Under clean room conditions, a solution of 150 mg of palladium/tetraoctylammonium bromide (elemental analysis: 68.80% Pd, the remaining 31.2% consists of tetraoctylammonium bromide which acts as a stabilizer to protect the particles from undesired agglomeration) in 1 ml of tetrahydrofuran is first prepared. The particle size of the colloids as determined by TEM is about 2 nm with spherical geometry. On Si substrates (3.9·3.9·0.5 mm) preliminarily cleaned in acetone in an ultrasonic bath, a colloid film is then generated by spin-coating. To this end, 35 µl of possibly freshly filtered colloid solution (filtration through 200 nm Teflon filter) is dropped onto the GaAs wafer, and the spin-coating process is started with the following parameters: rotational acceleration 20,000 rpm/s, rotational speed 9000 rpm, duration 15 s. The writing process is performed by placing the Si wafer in an electron microscope and exposing the colloid film with the electron beam. As the layout, a pattern is selected consisting of nine solid circles of 1 µm to 200 nm diameter. The exposure of the Si wafer is effected in the high magnification mode of the electron microscope with the following dose: D=400,000 µC/cm². The processing of the pattern is performed by simple washing of the Si wafer with tetrahydrofuran. Due to the redispersibility of the Pd colloid, the unexposed colloid film is washed off, and the exposed areas remain. Examinations show that all circles have been written with an elevation of 120 nm.

EXAMPLE 11

Preparation of Gold Patterns Using 3–12 nm Colloids or Clusters (21.56% Au)

Since the metal colloid is highly sensitive to air and moisture, all of the following operations must be performed under protective gas conditions. Under clean room conditions, a solution of 150 mg of gold/ tetraoctylammonium bromide (elemental analysis: 21.56% Au, the remaining 78.44% consists of tetraoctylammonium bromide which acts as a stabilizer to protect the particles from undesired agglomeration) in 1 ml of tetrahydrofuran is first prepared. The particle size of the colloids as determined by TEM is about 3–12 nm with spherical geometry. On GaAs substrates (3.9·3.9·0.5 mm) preliminarily cleaned in acetone in a n ultrasonic bath, a colloid film is then generated by spin-coating. To this end, 35 $\mu$l of possibly freshly filtered colloid solution (filtration through 200 nm Teflon filter) is dropped onto the GaAs wafer, and the spin-coating process is started with the following parameters: rotational acceleration 20,000 rpm/s, rotational speed 9000 rpm, duration 15 s. The writing process is performed by placing the GaAs wafer in an electron microscope and exposing the colloid film with the electron beam. As the layout, a pattern is selected consisting of five 20 nm wide, 31 $\mu$m long parallel tracks. The exposure of the GaAs wafer is effected in the high magnification mode of the electron microscope with the following dose: D=600,000 $\mu C/cm^2$. The processing of the pattern is performed by simple washing of the GaAs wafer with tetrahydrofuran in an ultrasonic bath. Due to the redispersibility of the Au colloid, the unexposed colloid film is washed off, and the exposed areas remain. Examinations show that patterns of 30.356 $\mu$m length, 94 nm width and 39 nm elevation have been written.

EXAMPLE 12

Preparation of Gold Patterns Using
[Au$_{55}$(PPh$_3$)$_{12}$Cl$_6$] Clusters

A solution of [Au$_{55}$(PPh$_3$)$_{12}$Cl$_6$] clusters in dichloromethane (as usual in the literature, the sample contains minor amounts of Au clusters which consist of more or less than 55 Au atoms) is spin-coated onto a GaAs wafer (rotational acceleration 20,000 rpm/s, rotational speed 9000 rpm, duration 18 s). The writing process is performed by placing the GaAs wafer in an electron microscope and exposing the film with the electron beam. As the layout, a pattern is selected consisting of three 25 nm wide, 25 $\mu$m long parallel tracks. The exposure of the film is effected in the high magnification mode of the electron microscope with the following dose: D=600,000 $\mu C/cm^2$. The processing of the pattern is performed by simple washing of the GaAs wafer with dichloromethane in an ultrasonic bath. Three structures (lines) each having a width of 40–50 nm are detected.

EXAMPLE 13

Preparation of Rhodium/Platinum Alloy Patterns
Using Defined [Rh$_{18}$Pt$_4$(CO)$_{35}$][(C$_8$H$_{17}$)$_4$N]$_4$
Clusters A solution of [Rh$_{18}$Pt$_4$(CO)$_{35}$][(C$_8$H$_{17}$)$_4$N]$_4$ clusters in THF is spin-coated onto a GaAs wafer and exposed with electrons as in Example 12. After the washing off of the unexposed clusters with THF in an ultrasonic bath, bimetallic Rh/Pt lines appear.

EXAMPLE 14

Preparation of Copper Patterns Using Defined
[Cu$_{12}$(PPh)$_6$(PPh$_3$)$_6$] Clusters A solution of [Cu$_{12}$(PPh)$_6$(PPh$_3$)$_6$] clusters in THF is spin-coated onto a GaAs wafer and exposed with electrons as in Example 12. After the washing off of the unexposed clusters with the in an ultrasonic bath, Cu containing lines appear the size of which is reduced by annealing at 190° C.

What is claimed is:

1. A lithographic method for generating nanostructures on a surface, said method comprising:

a) coating said surface with a solution to form a film on said surface, said solution comprising:
      i) soluble nanometer-sized tetraalkylammonium salt stabilized transition metal or bimetallic clusters or colloids of metals of groups 4–12 of the Periodic Table; or
      ii) stabilized metal oxide or metal sulfide analogs of i);

b) exposing at least one portion of said film imagewise with an electron beam;

c) washing off unexposed portions of said film, thereby leaving defined nanostructures on said surface; and d) optionally annealing said surface.

2. The method according to claim 1, wherein said solution comprises soluble nanometer-sized tetraalkylammonium salt stabilized transition metal or bimetallic clusters or colloids of metals of groups 4–12 of the Periodic Table.

3. The method according to claim 1, wherein said solution comprises soluble nanometer-sized tetraalkylammonium salt stabilized metal oxide or metal sulfide analogs of transition metal or bimetallic clusters or colloids of metals of groups 4–12 of the Periodic Table.

4. The method according to claim 1, wherein solvents selected from THF, toluene, dimethylformamide, ethanol, acetone or water are used for the coating and washing off.

5. The method according to claim 1, wherein Si, GaAs or SnO$_2$ wafers are used as the surface.

6. The method according to claim 1, wherein the size of the surface is in the range of from 0.05 to 4 cm$^2$.

7. The method according to claim 1, wherein said film has a layer thickness of from 0.3 nm to 2 $\mu$m.

8. The method according to claim 1, wherein an electron beam is imagewise directed or driven over the metal containing film in such a way that nanostructures with desired geometric properties are formed at the exposed areas, which are stripped and become visible after the washing off of the unexposed areas of the film.

9. The method according to claim 8, wherein the desired geometric forms are selected from lines or dots or columns.

10. The method according to claim 1, wherein the nanostructures are subjected to an aftertreatment by annealing at 150 to 400° C., optionally in an H$_2$ flow, for further purification and for increasing the conductivity, to form conductor tracks with optimum conductivity properties.

11. The method according to claim 1, wherein the size of the nanostructures can be reduced down to 10 nm, inter alia, by selecting particularly thin films and using scanning electron microscopes of maximum resolution as the electron beam source, while the generation of larger structures up to the micrometer range is possible through the use of thicker films and a well-aimed area-covering irradiation.

* * * * *